United States Patent
Maeda (10) Patent No.: US 7,862,153 B2
(45) Date of Patent: Jan. 4, 2011

(54) ELECTRICAL WIRING STRUCTURE, LIQUID EJECTION HEAD, LIQUID EJECTION APPARATUS AND IMAGE FORMING APPARATUS

(75) Inventor: Yasuhiko Maeda, Kanagawa-ken (JP)

(73) Assignee: FujiFilm Corporation, Tokyo (JP)

( * ) Notice: Subject to any disclaimer, the term of this patent is extended or adjusted under 35 U.S.C. 154(b) by 826 days.

(21) Appl. No.: 11/882,058

(22) Filed: Jul. 30, 2007

(65) Prior Publication Data

US 2008/0024561 A1 Jan. 31, 2008

(30) Foreign Application Priority Data

Jul. 31, 2006 (JP) .............................. 2006-208377

(51) Int. Cl.
*B41J 2/14* (2006.01)
*B41J 2/16* (2006.01)

(52) U.S. Cl. ........................................ 347/50; 347/58

(58) Field of Classification Search ............. 347/40–43, 347/49–50, 65–67
See application file for complete search history.

(56) References Cited

U.S. PATENT DOCUMENTS

| 5,939,789 | A | 8/1999 | Kawai et al. | |
|---|---|---|---|---|
| 6,530,650 | B2 * | 3/2003 | Ozaki et al. | 347/64 |
| 2010/0041252 | A1 * | 2/2010 | Mizukami et al. | 439/65 |

FOREIGN PATENT DOCUMENTS

| JP | 7-240582 A | 9/1995 |
|---|---|---|
| JP | 2003-234576 A | 8/2003 |

* cited by examiner

*Primary Examiner*—Thinh H Nguyen
(74) *Attorney, Agent, or Firm*—Birch, Stewart, Kolasch & Birch, LLP (57) ABSTRACT

The electrical wiring structure includes an electrical connection section where a first electrode and a second electrode are connected, wherein: the electrical connection section is formed by a first alloy containing at least gallium metal; and the first alloy has a melting point lower than 30° C.

12 Claims, 8 Drawing Sheets

ELECTRICAL WIRING STRUCTURE, LIQUID EJECTION HEAD, LIQUID EJECTION APPARATUS AND IMAGE FORMING APPARATUS

BACKGROUND OF THE INVENTION

1. Field of the Invention

The present invention relates to an electrical wiring structure, a liquid ejection head, a liquid ejection apparatus, and an image forming apparatus, and more particularly to an electrical wiring structure, a liquid ejection head, a liquid ejection apparatus, and an image forming apparatus, which guarantee the reliability of electrical connections even in cases where mechanical vibrations are applied.

2. Description of the Related Art

An inkjet recording apparatus comprises a recording head having a plurality of nozzles and forms a desired image on a recording medium by ejecting ink droplets from respective nozzles, while moving the recording head relatively with respect to the recording medium. In the recording head, a large number of electrical wires are provided in order to transmit drive signals for causing ink droplets to be ejected from the respective nozzles, and one important technological aspect is guaranteeing the reliability of the electrical connections where these electrical wires are connected. In particular, in the case of a method which ejects ink droplets from nozzles by pressurizing the ink inside pressure chambers by using the displacement of piezoelectric elements (a piezoelectric method), since a mechanical vibration is applied to the electrical connections, then it is important to guarantee the reliability of the electrical connections.

As a structure of electrical wires provided in a recording head, for example, there is a structure in which the individual electrodes of piezoelectric elements formed in one surface of a substrate are connected to lead electrodes formed in the other surface of the substrate via through electrodes which pass in the thickness direction of the substrate. The generally known methods of forming the through electrodes includes a method where conductive paste is filled into through holes formed in the thickness direction of the substrate, and a method where conductive material is deposited by plating. However, since a method based on filling conductive paste guarantees electrical conductivity by means of the conductive particles dispersed in the conductive paste mechanically making point contacts with the connected electrode (the individual electrode, lead electrode, or the like), the electrical resistance in the electrical connections is high and there is a possibility that conductivity may not be guaranteed if foreign matter is present on the connection surfaces. In particular, there is a possibility of disconnection in cases where a mechanism vibration is applied to the electrical connection. On the other hand, a plating method is restricted to substrates which can be used in a plating solution (for example, glass substrates cannot be used with strong alkalis), and furthermore, since the resulting through electrodes are hard, then there is a possibility that cracks may occur and disconnections may arise in the through electrodes if mechanical vibrations are applied. In this way, in either of these methods, it is difficult to guarantee reliability in the electrical connection sections in cases where mechanical vibrations are applied.

In this respect, Japanese Patent Application Publication No. 7-240582 and Japanese Patent Application Publication No. 2003-234576 disclose the techniques where electrical connection sections are made from an alloy material, using tin which is a low-melting-point metal (melting point: 232° C.), in order to ensure reliability of the electrical connections and good workability.

Although the electrical connections described in Japanese Patent Application Publication No. 7-240582 and Japanese Patent Application Publication No. 2003-234576 are in a liquid state when heat and pressure are applied during the formation of the electrical connections, they assume a solid state in the operational temperature range which is in the region of room temperature (room temperature to 150° C.). Therefore, if a mechanical vibration is applied to the electrical connections, then the disconnection may occur due to this vibration, and hence there is concern for reliability in the electrical connections.

SUMMARY OF THE INVENTION

The present invention has been contrived in view of these circumstances, an object thereof being to provide an electrical wiring structure, a liquid ejection head, a liquid ejection apparatus and an image forming apparatus whereby the reliability of electrical connections can be guaranteed even in cases where mechanical vibrations are applied.

In order to attain the aforementioned object, the present invention is directed to an electrical wiring structure comprising an electrical connection section where a first electrode and a second electrode are connected, wherein: the electrical connection section is formed by a first alloy containing at least gallium metal; and the first alloy has a melting point lower than 30° C.

In this aspect of the present invention, the electrical connection is constituted by an alloy which assumes a liquid state at room temperature (30° C.) or above, and therefore it is possible to ensure the electrical conduction without relying on mechanical point contacts, and the electrical resistance in the electrical connection can be reduced to a low value. In particular, even in a case where a mechanical vibration is applied, it is possible to absorb this vibration by means of the alloy which is in a liquid state, and therefore the reliability of the electrical connection can be guaranteed.

Preferably, one of the first electrode and the second electrode contains the gallium metal, and the other of the first electrode and the second electrode contains an alloying metal which produces the first alloy upon making contact with the gallium metal.

In this aspect of the present invention, since the electrical connection where the first and second electrodes are connected becomes an alloy, then it is possible to guarantee the reliability of the electrical connection.

Preferably, the alloying metal is one of indium, zirconium, tin, and aluminium.

Desirably, the metal (low-melting-point metal) which produces an alloy when it comes into contact with gallium metal is one of indium, zinc, tin and aluminium, and hence the electrical connection can become an alloy at a relatively low temperature (16° C. to 29° C.).

Preferably, the first electrode is a through electrode formed in a thickness direction of a substrate; and the second electrode is a connection electrode which is connected to an end portion of the through electrode.

This aspect of the present invention is one preferred embodiment to which the present invention has been applied, and it enables good reliability to be guaranteed in the electrical connection.

Preferably, the through electrode has a structure in which a conductive paste containing conductive particles is filled into a through hole formed in the thickness direction of the substrate.

Preferably, the conductive particles are simple particles made of the gallium metal.

Preferably, the conductive particles are coated particles having a surface coated with the gallium metal.

In this aspect of the present invention, it is possible to reduce the amount of gallium metal used, and therefore costs can be reduced.

Preferably, the conductive particles are simple particles made of a second alloy which contains the gallium metal and an alloying metal which produces the second alloy upon making contact with the gallium metal, or are coated particles having a surface coated with the second alloy.

In this aspect of the present invention, it is possible to change the melting point in accordance with the ratio of the gallium metal and the metal (low-melting-point metal) which produces the second alloy upon making contact with the gallium metal, and therefore handling during manufacture becomes easier. The second alloy may be the same as the first alloy, and the second alloy may be different from the first alloy. In terms of handling, it is desirable that, the gallium metal contained in the second alloy be adjusted so that the melting point of the second alloy is higher than that of the first alloy and the rate of the gallium metal contained in the second alloy can be adjusted so that the melting point of the second alloy becomes substantially the same as that of the first alloy.

In order to attain the aforementioned object, the present invention is also directed to a liquid ejection head comprising any one of the electrical wiring structures defined above.

Preferably, displacement of a piezoelectric element is used to pressurize liquid filled into a pressure chamber in such a manner that the liquid is ejected from a nozzle connected to the pressure chamber.

The present invention is suitable for a piezoelectric type of liquid ejection head, and even if a mechanical vibration is imparted to the electrical connection by the piezoelectric element, it is still possible to guarantee the reliability of the electrical connections.

In order to attain the aforementioned object, the present invention is also directed to a liquid ejection apparatus comprising one of the liquid ejection heads defined above.

In order to attain the aforementioned object, the present invention is also directed to an image forming apparatus comprising one of the liquid ejection heads defined above.

By improving the reliability of the electrical connection, it is possible to form an image of high quality.

According to the present invention, the electrical connection is constituted by an alloy which assumes a liquid state at room temperature (30° C.) or above, and therefore it is possible to ensure the electrical conduction without relying on a mechanical point contact, and the electrical resistance in the electrical connection can be reduced to a low value. In particular, even in a case where a mechanical vibration is applied, it is possible to absorb this vibration by means of the alloy which is in a liquid state, and therefore the reliability of the electrical connection can be guaranteed.

BRIEF DESCRIPTION OF THE DRAWINGS

The nature of this invention, as well as other objects and benefits thereof, will be explained in the following with reference to the accompanying drawings, in which like reference characters designate the same or similar parts throughout the figures and wherein.

DETAILED DESCRIPTION OF THE PREFERRED EMBODIMENTS

Figure 1:
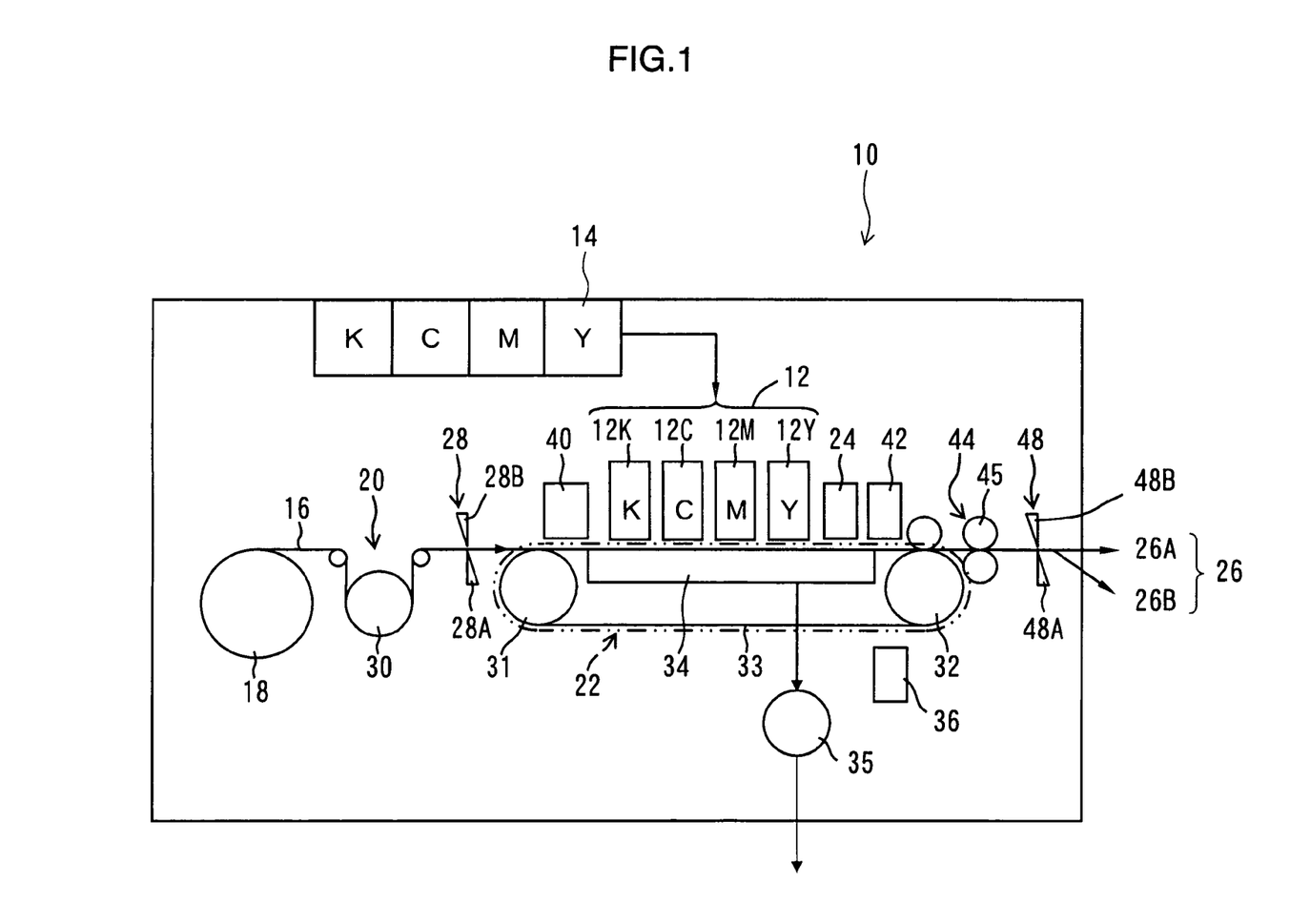
FIG. 1 is a general schematic drawing illustrating a general view of an inkjet recording apparatus.

Firstly, an inkjet recording apparatus which is one embodiment of the image forming apparatus according to an embodiment of the present invention is described below. FIG. 1 is a general schematic drawing illustrating an approximate general view of the inkjet recording apparatus. As shown in FIG. 1, the inkjet recording apparatus 10 comprises: a print unit 12 having a plurality of recording heads 12K, 12C, 12M, and 12Y for ink colors of black (K), cyan (C), magenta (M), and yellow (Y), respectively; an ink storing and loading unit 14 for storing inks of K, C, M and Y to be supplied to the recording heads 12K, 12C, 12M, and 12Y; a paper supply unit 18 for supplying recording paper 16; a decurling unit 20 for removing curl in the recording paper 16; a suction belt conveyance unit 22 disposed facing the nozzle face (ink-droplet ejection face) of the print unit 12, for conveying the recording paper 16 while keeping the recording paper 16 flat; a print determination unit 24 for reading the printed result produced by the print unit 12; and a paper output unit 26 for outputting image-printed recording paper (printed matter) to the exterior.

In FIG. 1, a magazine for rolled paper (continuous paper) is shown as an example of the paper supply unit 18; however, more magazines with paper differences such as paper width and quality may be jointly provided. Moreover, papers may be supplied with cassettes that contain cut papers loaded in layers and that are used jointly or in lieu of the magazine for rolled paper.

In the case of a configuration in which roll paper is used, a cutter 28 is provided as shown in FIG. 1, and the roll paper is cut to a desired size by the cutter 28. The cutter 28 has a stationary blade 28A, whose length is not less than the width of the conveyor pathway of the recording paper 16, and a round blade 28B, which moves along the stationary blade 28A. The stationary blade 28A is disposed on the reverse side of the printed surface of the recording paper 16, and the round blade 28B is disposed on the printed surface side across the conveyance path. When cut paper is used, the cutter 28 is not required.

In the case of a configuration in which a plurality of types of recording paper can be used, it is preferable that an information recording medium such as a bar code and a wireless tag containing information about the type of paper is attached to the magazine, and by reading the information contained in the information recording medium with a predetermined reading device, the type of paper to be used is automatically determined, and ink-droplet ejection is controlled so that the ink-droplets are ejected in an appropriate manner in accordance with the type of paper.

The recording paper 16 delivered from the paper supply unit 18 retains curl due to having been loaded in the magazine. In order to remove the curl, heat is applied to the recording paper 16 in the decurling unit 20 by a heating drum 30 in the direction opposite from the curl direction in the magazine. The heating temperature at this time is preferably controlled so that the recording paper 16 has a curl in which the surface on which the print is to be made is slightly round outward.

The decurled and cut recording paper 16 is delivered to the suction belt conveyance unit 22. The suction belt conveyance unit 22 has a configuration in which an endless belt 33 is set around rollers 31 and 32 so that the portion of the endless belt 33 facing at least the nozzle face of the print unit 12 and the sensor face of the print determination unit 24 forms a plane.

The belt 33 has a width that is greater than the width of the recording paper 16, and a plurality of suction apertures (not shown) are formed on the belt surface. A suction chamber 34 is disposed in a position facing the sensor surface of the print determination unit 24 and the nozzle surface of the print unit 12, on the interior side of the belt 33, which is set around the rollers 31 and 32, as shown in FIG. 1. The suction chamber 34 provides suction with a fan 35 to generate a negative pressure, and the recording paper 16 on the belt 33 is held by suction.

The belt 33 is driven in the clockwise direction in FIG. 1 by the motive force of a motor (not illustrated) being transmitted to at least one of the rollers 31 and 32, which the belt 33 is set around, and the recording paper 16 held on the belt 33 is conveyed from left to right in FIG. 1.

Since ink adheres to the belt 33 when a marginless print job or the like is performed, a belt-cleaning unit 36 is disposed in a predetermined position on the exterior side of the belt 33 (a suitable position outside the printing area). Although the details of the configuration of the belt-cleaning unit 36 are not shown, examples thereof include a configuration in which the belt 33 is nipped with cleaning rollers such as a brush roller and a water absorbent roller, an air blow configuration in which clean air is blown onto the belt 33, or a combination of these. In the case of the configuration in which the belt 33 is nipped with the cleaning rollers, it is preferable to make the line velocity of the cleaning rollers different than that of the belt 33 to improve the cleaning effect.

The inkjet recording apparatus 10 can comprise a roller nip conveyance mechanism instead of the suction belt conveyance unit 22. However, there is a drawback in the roller nip conveyance mechanism that the print tends to be smeared when the printing area is conveyed by the roller nip action because the nip roller makes contact with the printed surface of the paper immediately after printing. Therefore, the suction belt conveyance in which nothing comes into contact with the image surface in the printing area is preferable.

A heating fan 40 is disposed on the upstream side of the print unit 12 in the conveyance pathway formed by the suction belt conveyance unit 22. The heating fan 40 blows heated air onto the recording paper 16 to heat the recording paper 16 immediately before printing so that the ink deposited on the recording paper 16 dries more easily.

The print unit 12 is a so-called "full line head" in which a line head having a length corresponding to the maximum paper width is arranged in a direction (main scanning direction) that is perpendicular to the paper conveyance direction (sub-scanning direction). The recording heads 12K, 12C, 12M and 12Y forming the print unit 12 are constituted by line heads in which a plurality of ink ejection ports (nozzles) are arranged through a length exceeding at least one edge of the maximum size recording paper 16 intended for use with the inkjet recording apparatus 10.

The recording heads 12K, 12C, 12M, and 12Y are arranged in the order of black (K), cyan (C), magenta (M), and yellow (Y) from the upstream side (left side in FIG. 1), along the conveyance direction of the recording paper 16 (paper conveyance direction). A color image can be formed on the recording paper 16 by ejecting the inks from the recording heads 12K, 12C, 12M, and 12Y, respectively, onto the recording paper 16 while conveying the recording paper 16.

The print unit 12, in which the full-line heads covering the entire width of the paper are thus provided for the respective ink colors, can record an image over the entire surface of the recording paper 16 by performing the action of moving the recording paper 16 and the print unit 12 relative to each other in the paper conveyance direction (the sub-scanning direction) just once (in other words, by means of a single sub-scan). Higher-speed printing is thereby made possible and productivity can be improved in comparison with a shuttle type head configuration in which a recording head moves reciprocally in a direction (main-scanning direction) that is perpendicular to paper conveyance direction.

Although the configuration with the KCMY four standard colors is described in the present embodiment, combinations of the ink colors and the number of colors are not limited to those. Light inks or dark inks can be added as required. For example, a configuration is possible in which recording heads for ejecting light-colored inks such as light cyan and light magenta are added.

As shown in FIG. 1, the ink storing and loading unit 14 has ink tanks for storing the inks of the colors corresponding to the respective recording heads 12K, 12C, 12M, and 12Y, and the respective tanks are connected to the recording heads 12K, 12C, 12M, and 12Y by means of channels (not shown). The ink storing and loading unit 14 has a warning device (for example, a display device or an alarm sound generator) for warning when the remaining amount of any ink is low, and has a mechanism for preventing loading errors among the colors.

The print determination unit 24 has an image sensor (line sensor and the like) for capturing an image of the ink-droplet deposition result of the print unit 12, and functions as a device to check for ejection defects such as clogs of the nozzles in the print unit 12 from the ink-droplet deposition results evaluated by the image sensor.

The print determination unit 24 of the present embodiment is configured with at least a line sensor having rows of photoelectric transducing elements with a width that is greater than the ink-droplet ejection width (image recording width) of the recording heads 12K, 12C, 12M, and 12Y. This line sensor has a color separation line CCD sensor including a red (R) sensor row composed of photoelectric transducing elements (pixels) arranged in a line provided with an R filter, a green (G) sensor row with a G filter, and a blue (B) sensor row with a B filter. Instead of a line sensor, it is possible to use an area sensor composed of photoelectric transducing elements which are arranged two-dimensionally.

The print determination unit 24 reads a test pattern image printed by the print heads 12K, 12C, 12M, and 12Y for the respective colors, and the ejection of each head is determined. The ejection determination includes the presence of the ejection, measurement of the dot size, and measurement of the dot deposition position.

A post-drying unit 42 is disposed following the print determination unit 24. The post-drying unit 42 is a device to dry the printed image surface, and includes a heating fan, for example. It is preferable to avoid contact with the printed surface until the printed ink dries, and a device that blows heated air onto the printed surface is preferable.

In cases in which printing is performed with dye-based ink on porous paper, blocking the pores of the paper by the application of pressure prevents the ink from coming contact with ozone and other substances that cause dye molecules to break down, and has the effect of increasing the durability of the print.

A heating/pressurizing unit 44 is disposed following the post-drying unit 42. The heating/pressurizing unit 44 is a device to control the glossiness of the image surface, and the image surface is pressed with a pressure roller 45 having a predetermined uneven surface shape while the image surface is heated, and the uneven shape is transferred to the image surface.

The printed matter generated in this manner is outputted from the paper output unit 26. The target print (i.e., the result of printing the target image) and the test print are preferably outputted separately. In the inkjet recording apparatus 10, a sorting device (not shown) is provided for switching the outputting pathways in order to sort the printed matter with the target print and the printed matter with the test print, and to send them to paper output units 26A and 26B, respectively. When the target print and the test print are simultaneously formed in parallel on the same large sheet of paper, the test print portion is cut and separated by a cutter (second cutter) 48. The cutter 48 is disposed directly in front of the paper output unit 26, and is used for cutting the test print portion from the target print portion when a test print has been performed in the blank portion of the target print. The structure of the cutter 48 is the same as the first cutter 28 described above, and has a stationary blade 48A and a round blade 48B. Although not illustrated, the paper output unit 26A for the target prints is provided with a sorter for collecting prints according to print orders.

Next, a recording head which is one embodiment of a liquid ejection head according to an embodiment of the present invention is described below. The recording heads 12K, 12C, 12M and 12Y provided for the respective ink colors have the same structure, and a reference numeral 50 is hereinafter designated to a representative example of these recording heads.

Figure 2:
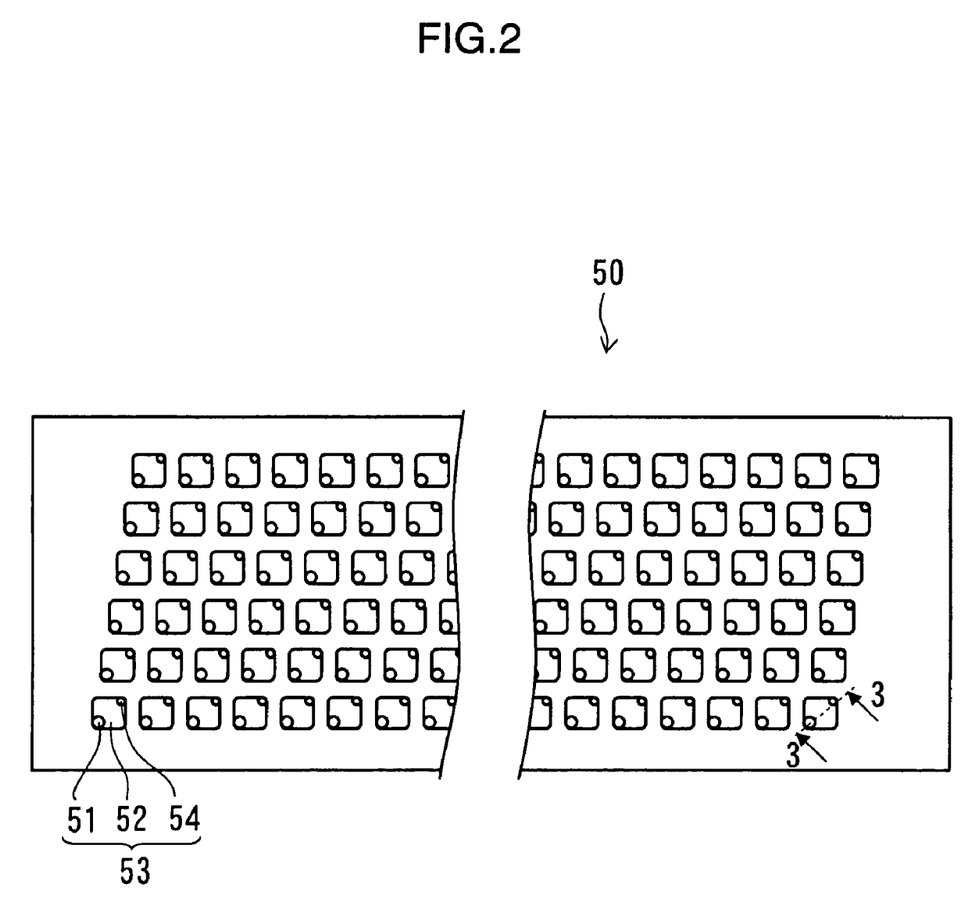
FIG. 2 is a perspective plan diagram of a recording head.

FIG. 2 is a plan view perspective diagram illustrating a structural example of the recording head 50. As shown in FIG. 2, the recording head 50 has a structure in which a plurality of ink chamber units (liquid droplet ejection elements) 53, each comprising an ink ejection nozzle 51, a pressure chamber 52, and an ink supply port 54, are arranged in a (two-dimensional) staggered matrix configuration, in such a manner that the nozzles 51 are arranged at high density at a uniform nozzle pitch when projected to an alignment in the lengthwise direction of the head (the direction perpendicular to the paper conveyance direction). Thereby, it is possible effectively to achieve a high density of the dot pitch, and to form images of high quality.

The pressure chamber 52 provided corresponding to each of the nozzles 51 is approximately square-shaped in plan view, and a nozzle 51 and an ink supply port 54 are provided respectively at either corner of a diagonal of the pressure chamber 52.

Figure 3:
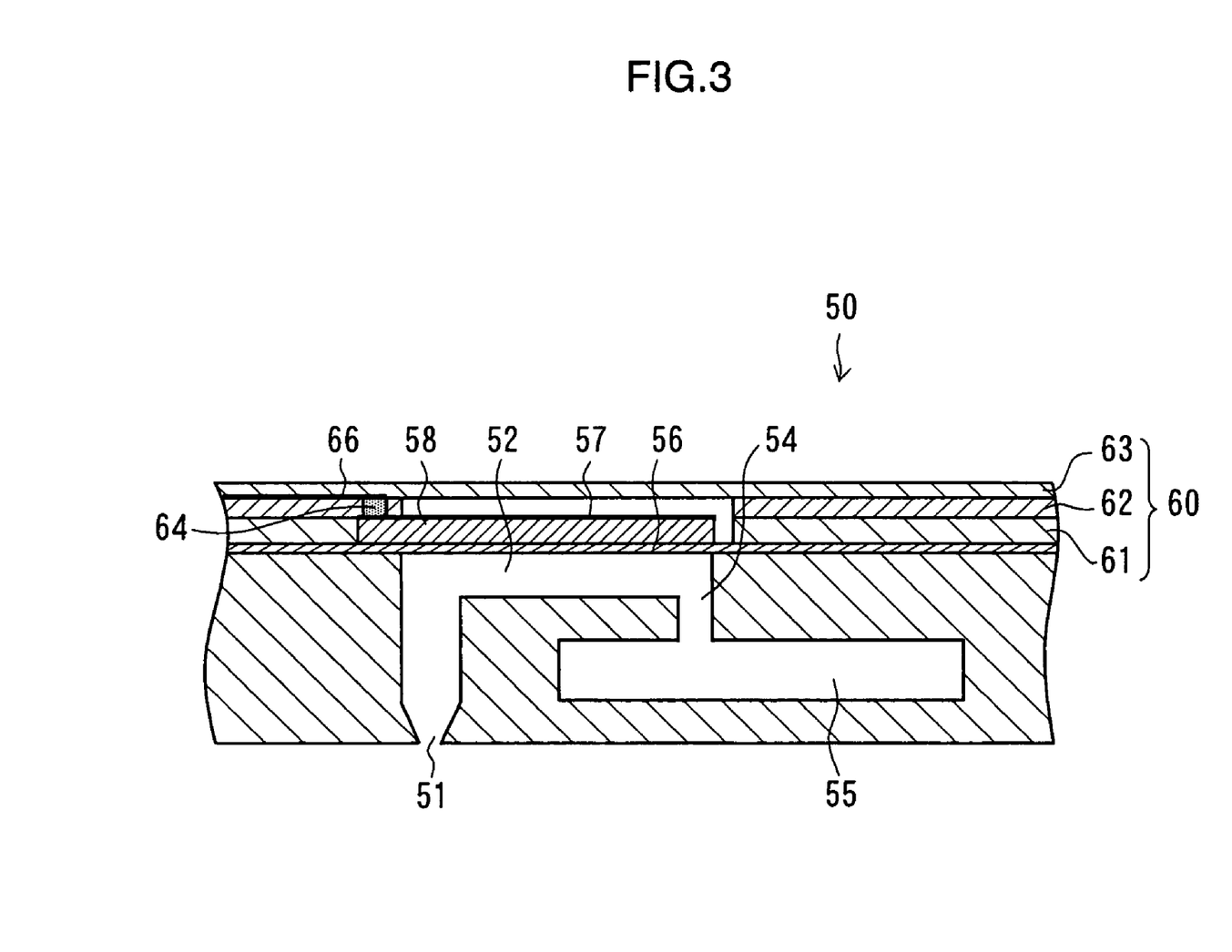
FIG. 3 is a cross-sectional diagram along line 3-3 in FIG. 2.

FIG. 3 is a cross-sectional diagram illustrating one portion of a recording head 50 (a cross-sectional diagram along line 3-3 in FIG. 2). As shown in FIG. 3, each nozzle 51 is connected to a corresponding pressure chamber 52. Furthermore, a supply port 54 for supplying ink to the pressure chamber 52 is formed at one end of the pressure chamber 52, and the pressure chamber 52 is connected to a common flow channel 55 via the supply port 54. Ink supplied from an ink tank (not illustrated) forming an ink source is accumulated in the common flow channel 55. The ink inside the common flow channel 55 is supplied via the supply port 54 to the pressure chamber 52, and this ink is filled into the pressure chamber 52.

The upper wall of the pressure chamber 52 is constituted by a diaphragm 56, and a piezoelectric element 58 provided with an individual electrode 57 is bonded onto the diaphragm 56 at a position corresponding to the pressure chamber 52 (in other words, at a position opposing the pressure chamber 52 via the diaphragm 56). The diaphragm 56 also serves as a common electrode for the piezoelectric elements 58.

A multiple-layer wiring substrate 60 comprising a lower substrate 61, an intermediate substrate 62 and an upper substrate 63 is bonded to the side of the diaphragm 56 where the piezoelectric elements 58 are formed. Through electrodes 64 are formed in the intermediate substrate 62 in the thickness direction thereof, and one end portion (the lower end) of each through electrode 64 is connected to the individual electrode 57 for the piezoelectric element 58, while the other end portion (the upper end) of each through electrode 64 is connected to a lead electrode 66, which is formed on the upper substrate 63, on the side thereof adjacent to the intermediate substrate 62. A drive signal generated by a drive circuit (not illustrated) is supplied from the lead electrode 66 to the individual electrode 57 for the piezoelectric element 58, via the through electrode 64.

When a drive signal is supplied to the piezoelectric element 58, the volume of the pressure chamber 52 changes due to deformation of the diaphragm 56 caused by displacement of the piezoelectric element 58, thereby pressurizing the ink inside the pressure chamber 52 and causing an ink droplet to be ejected from the nozzle 51. A piezoelectric body, such as a piezo element, is suitable for use as the piezoelectric element 58. After ejection of ink, when the supply of the drive signal is released, the diaphragm 56 reverts to its original state, and ink is supplied from the common flow channel 55 to the pressure chamber 52 via the supply port 54.

In the present embodiment, a piezoelectric method which ejects ink by using the displacement of a piezoelectric element is adopted as the ink ejection method, but the implementation of the present invention is not limited to this and it is also possible to adopt, for example, a thermal method which uses the thermal energy produced by a heating element, such as a heater, to generate an air bubble inside a pressure chamber, an ink droplet being ejected from a nozzle because of the pressure created by this bubble.

Figure 4:
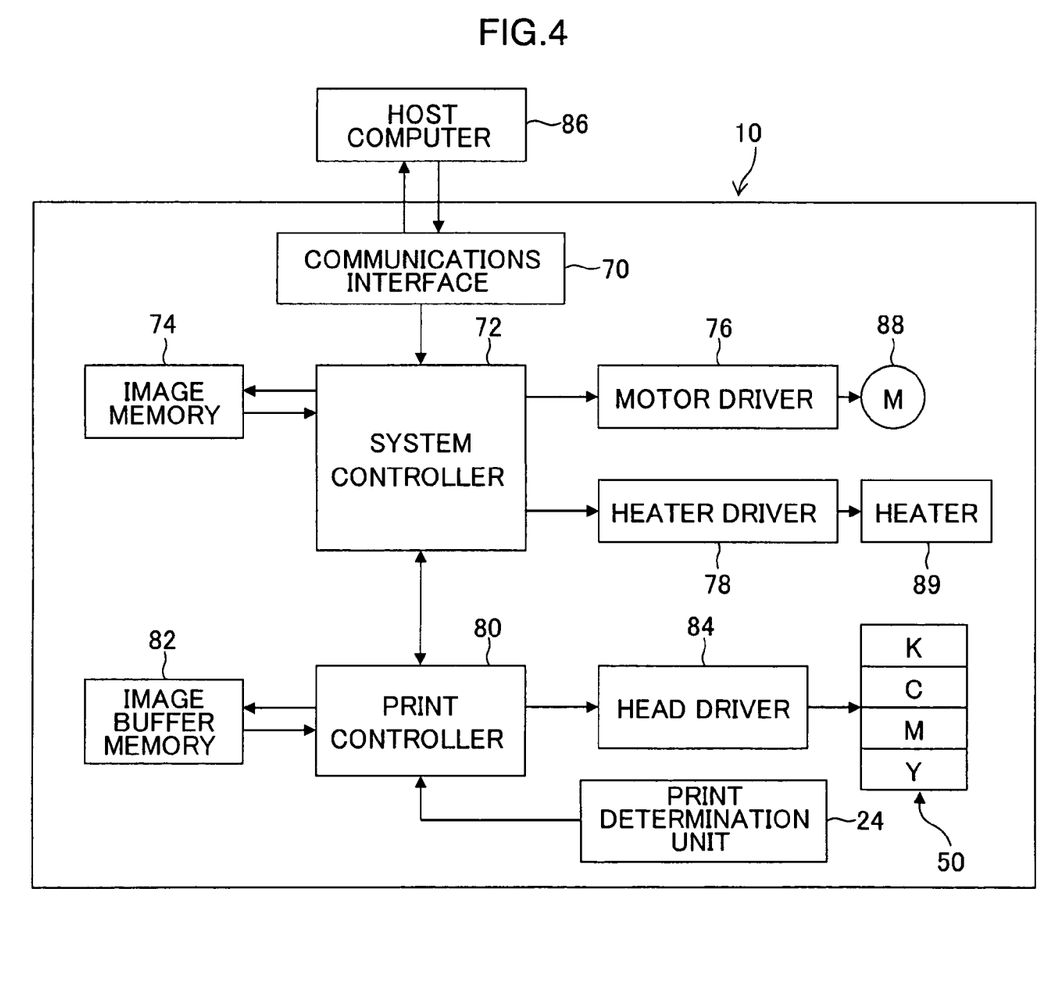
FIG. 4 is a principal block diagram illustrating a system composition of the inkjet recording apparatus.

Next, the control system of the inkjet recording apparatus 10 is described below. FIG. 4 is a principal block diagram illustrating a system composition of the inkjet recording apparatus 10. The inkjet recording apparatus 10 comprises a communications interface 70, a system controller 72, an image memory 74, a motor driver 76, a heater driver 78, a print controller 80, an image buffer memory 82, a head driver 84, and the like.

The communications interface 70 is an interface unit for receiving image data sent from a host computer 86. A serial interface or a parallel interface may be used as the communications interface 70. A buffer memory (not shown) may be mounted in this portion in order to increase the communication speed.

The image data sent from the host computer 86 is received by the inkjet recording apparatus 10 through the communications interface 70, and is temporarily stored in the image memory 74. The image memory 74 is a storage device for temporarily storing images inputted through the communications interface 70, and data is written and read to and from the image memory 74 through the system controller 72. The image memory 74 is not limited to a memory composed of semiconductor elements, and a hard disk drive or another magnetic medium may be used.

The system controller 72 is a control unit for controlling the various sections, such as the communications interface 70, the image memory 74, the motor driver 76, the heater driver 78, and the like. The system controller 72 is constituted by a central processing unit (CPU) and peripheral circuits thereof, and the like, and in addition to controlling communications with the host computer 86 and controlling reading and writing from and to the image memory 74, or the like, it also generates control signals for controlling the motor 88 of the conveyance system and the heater 89.

The motor driver (drive circuit) 76 drives the motor 88 in accordance with commands from the system controller 72. The heater driver 78 drives the heater 89 of the post-drying unit 42 and the like in accordance with commands from the system controller 72.

The print controller 80 has a signal processing function for performing various tasks, compensations, and other types of processing for generating print control signals from the image data stored in the image memory 74 in accordance with commands from the system controller 72 so as to supply the generated print control signals (dot data) to the head driver 84. Required signal processing is carried out in the print controller 80, and the ejection amount and the ejection timing of the ink droplets from the recording head 50 are controlled via the head driver 84, on the basis of the print data. By this means, desired dot size and dot positions can be achieved.

The print controller 80 is provided with the image buffer memory 82; and image data, parameters, and other data are temporarily stored in the image buffer memory 82 when image data is processed in the print controller 80. The aspect shown in FIG. 4 is one in which the image buffer memory 82 accompanies the print controller 80; however, the image memory 74 may also serve as the image buffer memory 82. Also possible is an aspect in which the print controller 80 and the system controller 72 are integrated to form a single processor.

The head driver 84 generates drive signals for driving the piezoelectric elements 58 of the recording heads 50 of the respective colors (see FIG. 3) on the basis of the print data supplied from the print controller 80, and it supplies the drive signals thus generated to the piezoelectric elements 58. A feedback control system for maintaining constant drive conditions for the recording heads 50 may be included in the head driver 84.

The print determination unit 24 is a block that includes the line sensor as described above with reference to FIG. 1, reads the image printed on the recording paper 16, determines the print conditions (presence of the ejection, variation in the dot formation, and the like) by performing required signal processing, or the like, and provides the determination results of the print conditions to the print controller 80.

According to requirements, the print controller 80 makes various corrections with respect to the recording head 50 on the basis of information obtained from the print determination unit 24.

Next, the electrical wiring structure which is a characteristic feature of the present invention is described below.

Figure 5:
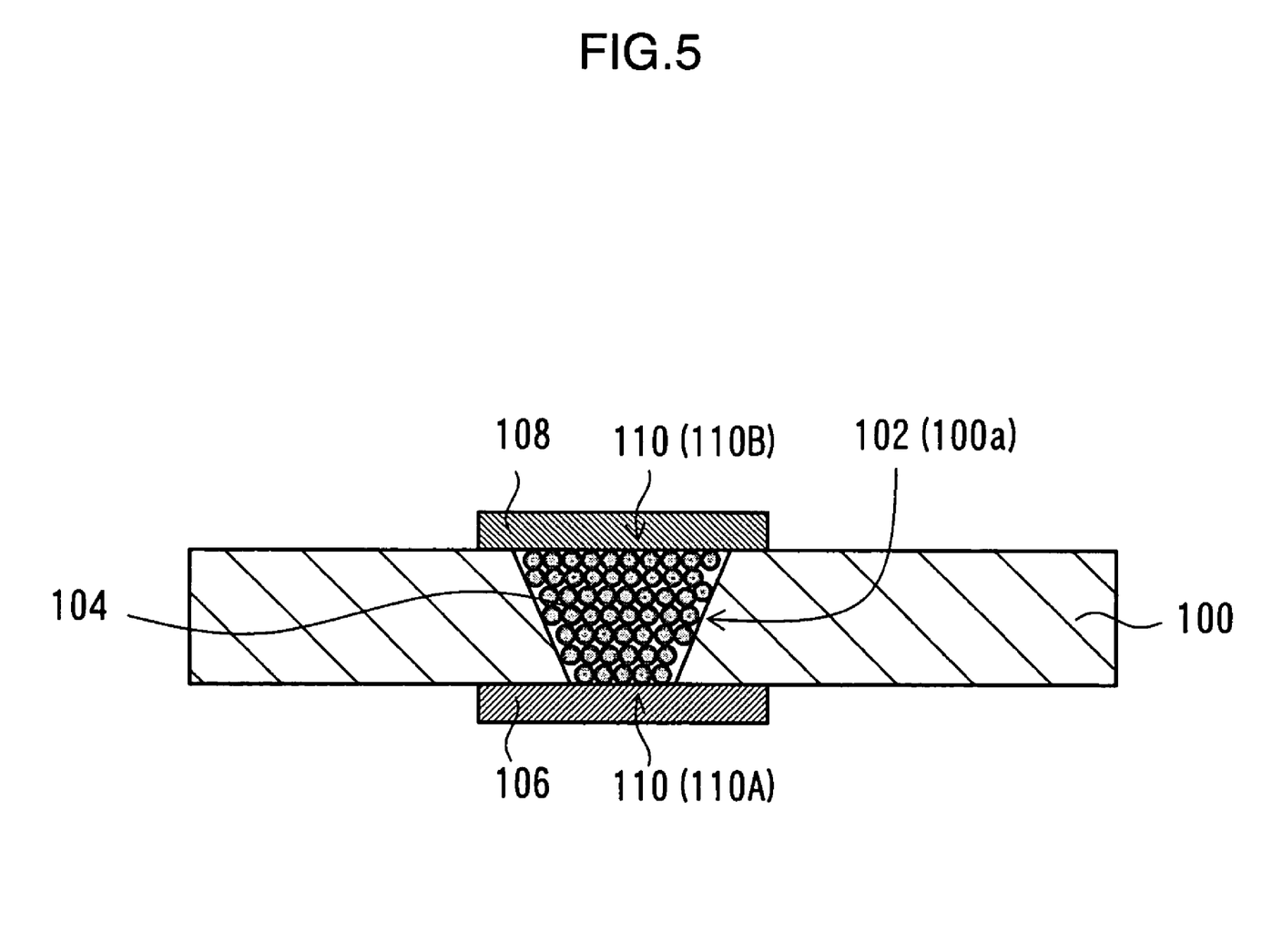
FIG. 5 is a cross-sectional diagram illustrating one example of the structure of a wiring substrate according to an embodiment of the present invention.

FIG. 5 is a cross-sectional diagram illustrating one example of an electrical wiring structure according to an embodiment of the present invention. As shown in FIG. 5, the through electrode 102 passing in the thickness direction of the resin substrate 100 is formed by filling a conductive paste 104 having conductive particles and resin as main components, into a through hole 100a formed in the thickness direction. One end portion (the lower end) of the through electrode 102 is connected to a lower connection electrode 106, and the other end portion (upper end) thereof is connected to an upper connection electrode 108. The resin substrate 100, the through electrode 102, the lower connection electrode 106 and the upper connection electrode 108 respectively correspond to the intermediate substrate 62, the through electrode 64, the individual electrode 57 and the lead electrode 66 shown in FIG. 3. The lower connection electrode 106 and the upper connection electrode 108 may be respectively formed directly onto the upper and lower surfaces of the resin substrate 100, or they may be formed on another substrate which is stacked on the resin substrate 100.

In the present embodiment, in addition to using simple particles made of gallium (Ga) metal as the conductive particles contained in the conductive paste 104, a metal which produces an alloy reaction when it makes contact with the Ga metal and creates an alloy having a melting point of less than 30° C., in other words, a metal which itself has a low melting point (low-melting-point metal), is used as a constituent metal of each of the connection electrodes 106 and 108. Low-melting-point metals of this kind are, for example, indium (In), zinc (Zn), tin (Sn), aluminium (Al), and the like.

Figure 6A:
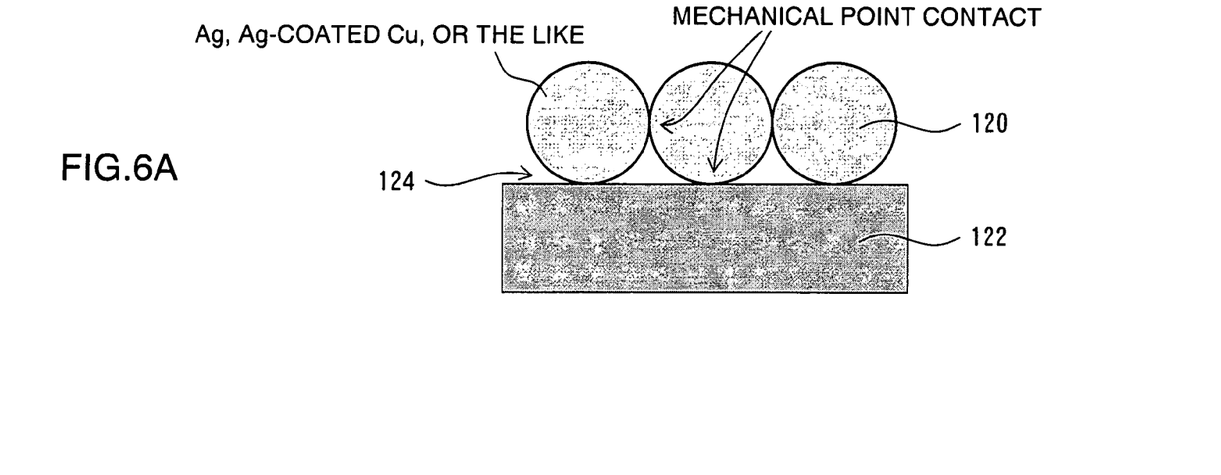
FIGS. 6A and 6B are illustrative diagrams illustrating the operational principles of an embodiment of the present invention.
Figure 6B:
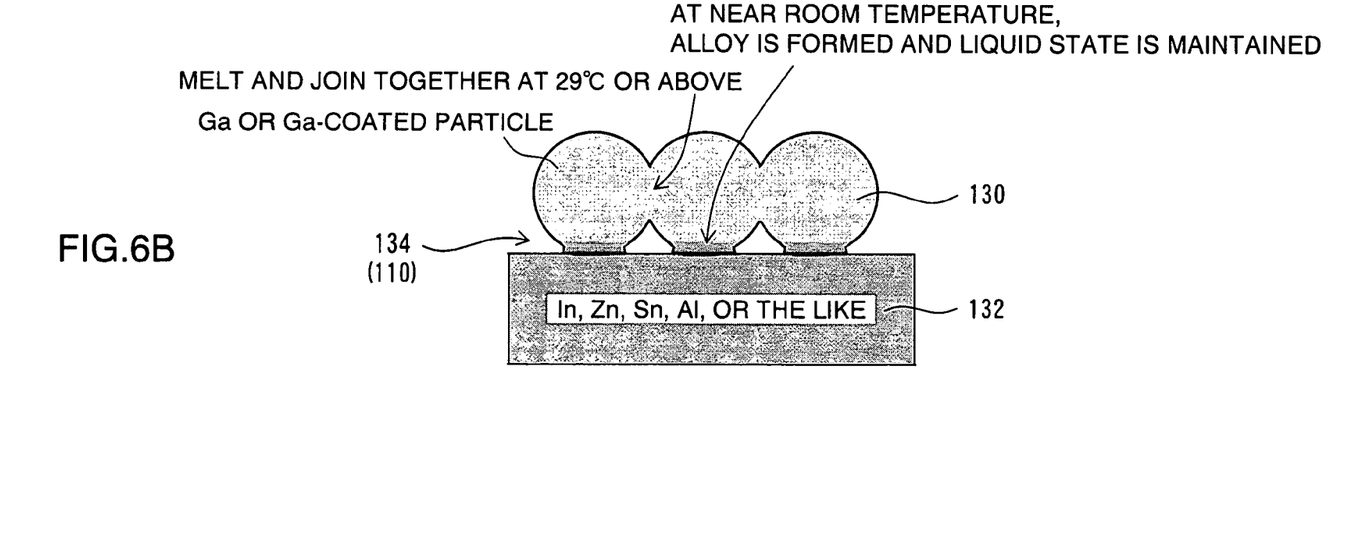

FIGS. 6A and 6B are illustrative diagrams illustrating the operational principles of an embodiment of the present invention, and they depict a schematic enlarged view of a portion corresponding to the electrical connection sections 110 (110A, 110B) where the through electrode 102 in FIG. 5 is connected to the connection electrodes 106 and 108.

As shown in FIG. 6A, in general, simple particles made of a metal such as Ag, Au, Ni, Sn, Cu, or Pb, and coated particles having the surface coated with the aforementioned metal such as Ag (for example, a Cu metal particle having the surface coated with Ag) are used as conductive particles 120 contained in the conductive paste. In this case, in principle, the conductive particles 120 and the connection electrode 122 only make mechanical point contacts, and the electrical resistance in the electrical connection 124 is high. Furthermore, if foreign matter is present on the surface of the connection electrode 122 adjacent to the conductive particles 120, then the conductive particles 120 lose the possibility of making contact with the connection electrode 122, and hence the electrical resistance of the electrical connection 124 rises yet further and the variation in the electrical resistance also increases. Consequently, there is a possibility that a situation may arise where electrical conductivity does not be guaranteed.

Therefore, in the present embodiment, as shown in FIG. 6B, simple particles made of Ga metal (Ga metal particles) are used as conductive particles 130 contained in the conductive paste and a low-melting-point metal (In, Zn, Sn, Al, or the like) is used as a connection electrode 132, so that an alloy containing at least Ga metal is formed in the electrical connections 134 where the through electrode 102 connects with the connection electrodes 106 and 108. The melting-point of the alloy is less than 30° C.

Consequently, since each electrical connection 134 is constituted by the alloy which assumes a liquid state at room temperature (30° C.) or above, it is possible to ensure electrical conduction without relying on mechanical point contacts, and the electrical resistance in the electrical connection 134 can be reduced to a low value. In particular, even in a case where a mechanical vibration is applied, this vibration can be absorbed by means of the alloy which is in a liquid state, and therefore the reliability of the electrical connections 134 can be guaranteed.

Furthermore, the melting point of the Ga metal is 29° C., which is relatively lower than that of other metals. Even in a case where the Ga metal is dispersed inside the conductive paste, by heating the Ga metal once to a temperature at or above the melting point, the conductive particles 130 join together due to melting and electrical conduction can be guaranteed to a higher degree of reliability than the electrical conduction achieved by point contacts between conductive particles 120 as shown in FIG. 6A.

Figure 7A:
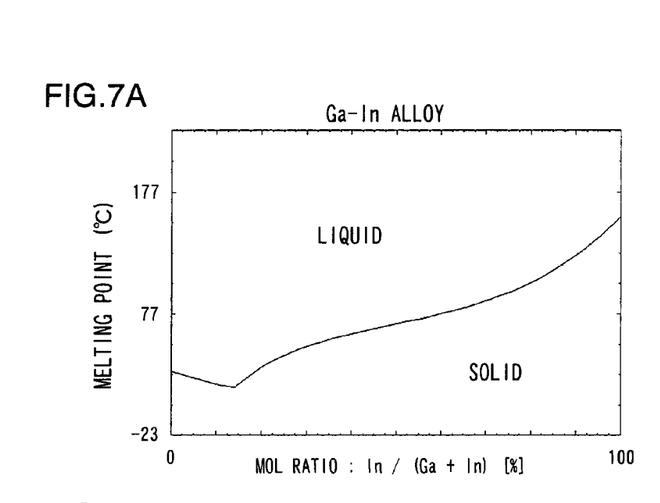
FIGS. 7A to 7D are graphs illustrating the melting points of alloys made of Ga metal and low-melting-point metals (In, Zn, Sn, Al)
Figure 7B:
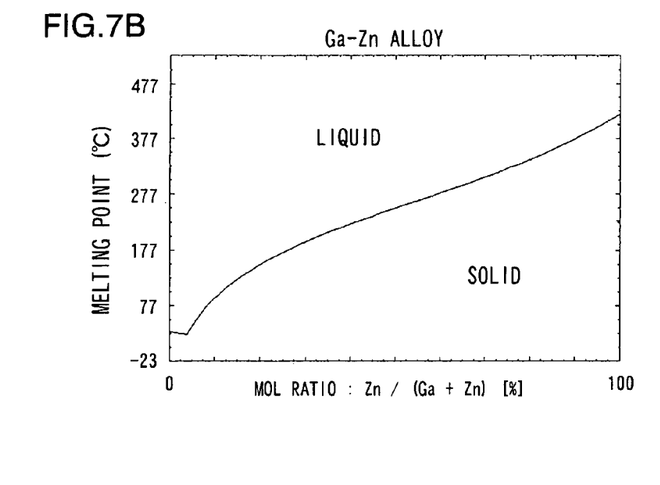
Figure 7C:
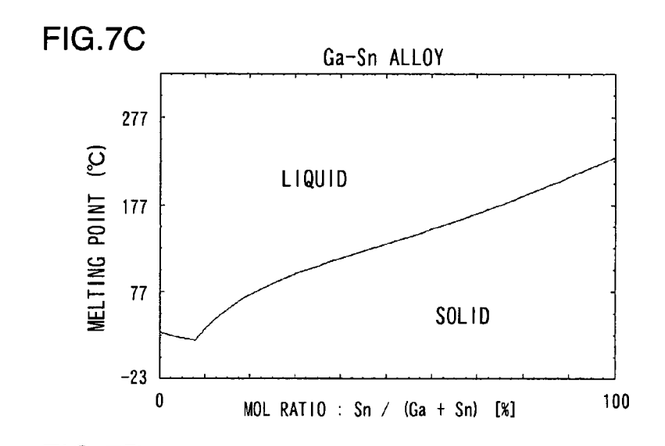
Figure 7D:
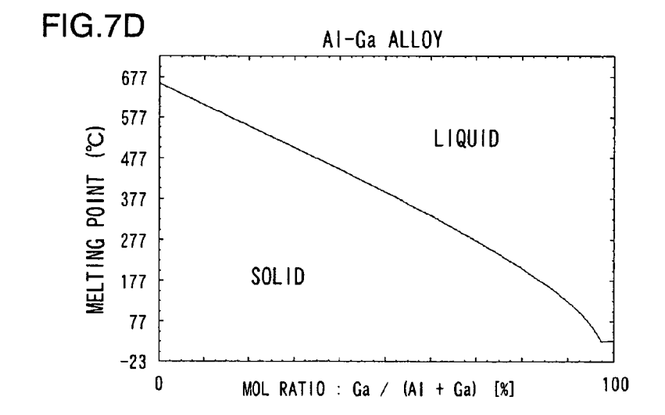

FIGS. 7A to 7D are graphs illustrating the melting points of alloys made of Ga metal and low-melting-point metals (In, Zn, Sn, Al), in which the horizontal axis represents the ratio (mol ratio) of the low-melting-point metal and the vertical axis represents the melting point of the alloy. FIG. 7A shows the melting point of an alloy made of Ga and In (Ga—In alloy), in which the melting point when the In ratio is 0% (in other words, the melting point of Ga) is 29° C. From this point, the melting point of the Ga—In alloy gradually falls in accordance with the increase of the In ratio. The melting point reaches a minimum at 16° C. when the In ratio is approximately 15%, whereupon the melting point gradually increases as the ratio of In increases and the melting point reaches 157° C. when the In ratio is 100% (in other words, the melting point of In).

In this way, since the melting point of the alloy made of Ga metal and a low-melting-point metal changes in accordance with the ratio between the Ga metal and the low-melting-point metal, then in a composition illustrated in FIG. 6B, it is desirable that the melting point of the alloy formed in the electrical connections 134 be less than 30° C. More specifically, it is desirable that, the In ratio should be 18% or less in the case of the Ga—In alloy in FIG. 7A, the Zn ratio should be 5% or less in the case of the Ga—Zn alloy in FIG. 7B, the Sn ratio should be 10% or less in the case of the Ga—Sn alloy in FIG. 7C, and the Al ratio should be 3% or less in the case of the Ga—Al alloy in FIG. 7D. In other words, supposing that the compositional ratio of the In, Zn, Sn or Al low-melting-point metal is x %, then in the overall metal composition in the conductive particles and the connection electrodes, the ratio of Ga is set to be equal to or greater than (100−x) %.

Figure 8A:
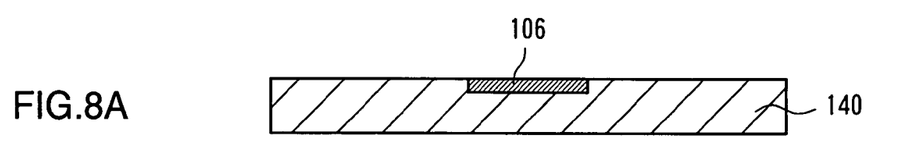
FIGS. 8A to 8E are process diagrams illustrating one example of an electrical connection method.
Figure 8B:
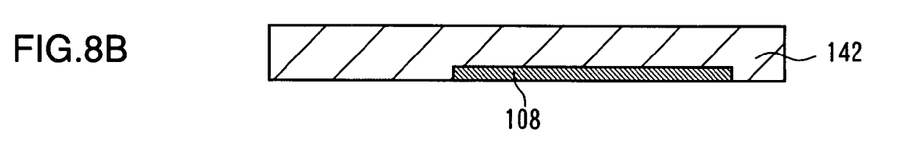

FIGS. 8A to 8E are process diagrams illustrating one example of the electrical connection method. Firstly, as shown in FIG. 8A, a lower connection electrode 106 constituted by a low-melting-point metal (In, Zn, Sn, Al, or the like) is formed by screen printing, or the like, onto one surface of the lower substrate 140. A film of the low-melting-point metal may be deposited by plating, vapor deposition, sputtering, or the like, onto the surface of an underlying electrode made of another metal (for example, Cu, Ag, Au, or the like). Furthermore, as shown in FIG. 8B, an upper connection electrode 108 is also formed on one surface of the upper substrate 142, by a similar method to the lower substrate 140.

Figure 8C:
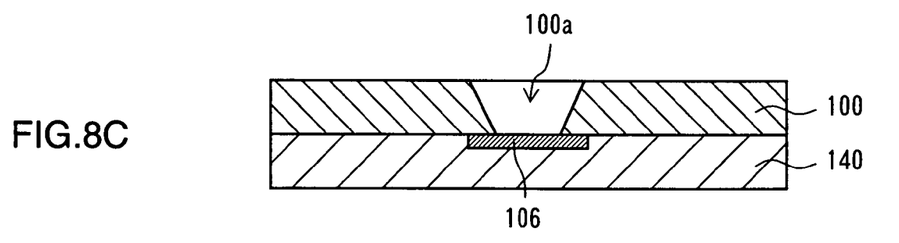

Next, as shown in FIG. 8C, a resin substrate 100 formed with a through hole 100a is stacked onto the lower substrate 140, on the side adjacent to the lower connection electrode 106, via an adhesive layer (not illustrated). In this, the substrates are aligned in position in such a manner that the through hole 100a is superimposed over the lower connection electrode 106. For the adhesive layer, it is possible to use an epoxy-based, polyimide-based or silicon-based thermally curable adhesive film, or the like. Moreover, it is also possible to put a flat plate-shaped resin substrate 100 onto the lower substrate 140 via a bonding layer, and to then form a through hole 100a in the resin substrate 100 by means of a mechanical process, such as laser processing using a $CO_2$ laser, a UV laser, or an excimer laser, or drilling, or the like.

Figure 8D:
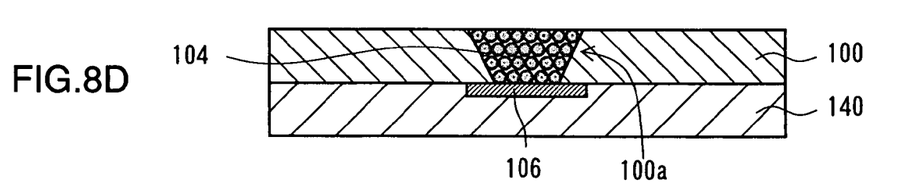

Next, as shown in FIG. 8D, a conductive paste 104 comprising Ga metal particles as conductive particles is filled into the through hole 100a. In this process, the conductive paste is filled at a temperature below the melting point of Ga (29° C.), in order that the Ga metal does not melt.

Figure 8E:
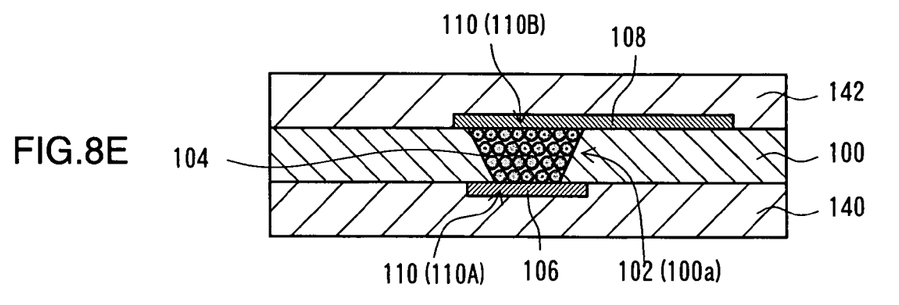

Thereupon, as shown in FIG. 8E, the upper substrate 142 is put onto the resin substrate 100, on the side thereof opposite to the lower substrate 140, via a similar adhesive layer (not illustrated). In this step, the side of the upper substrate 142 adjacent to the upper connection electrode 108 is disposed towards the resin substrate 100, and the substrates are aligned in position in such a manner that the upper connection electrode 108 and the through hole 100a are mutually superimposed. Thereupon, the whole laminated structure is unified by pressurizing and heating the lower substrate 140, the resin substrate 100 and the upper substrate 142. By this means, the upper connection electrode 108 and the lower connection electrode 106 disposed on the front and rear surfaces of the resin substrate 100 are connected electrically via the through electrode 102 passing in the thickness direction of the resin substrate 100. By composing the through electrode 102 and the connection electrodes 106 and 108 as stated above, an alloy having a melting point lower than 30° C. is formed in the electrical connection sections 110 (110A, 110B) where these electrodes connect together. Consequently, since the alloy of electrical connections 110 assumes a liquid state at room temperature (30° C.) or above, then it is possible to ensure electrical conduction in a state where there are no mechanical point contacts, and the electrical resistance in the electrical connection 110 can be reduced to a low value. In particular, even in a case where a mechanical vibration is applied to the electrical connections 110, this vibration are absorbed by means of the alloy which is in a liquid state, and therefore the reliability of the electrical connections 110 can be guaranteed.

The present embodiment shows an example where Ga metal particles are used as the conductive particles 130 contained in the conductive paste, but the implementation of the present invention is not limited to this. For example, it is also possible to use coated particles formed by coating the surface of resin particles or metal particles with Ga metal. In this case, it is possible to reduce the amount of Ga metal used.

Furthermore, it is also possible to use, as the conductive particles 130, simple particles of an alloy made of Ga metal and a low-melting-point metal or coated particles having a surface coated with this alloy. For example, in the case shown in FIG. 7A, if a Ga—In alloy having an In ratio of 50% is used, then the melting point of the alloy is approximately 70° C., which makes handling easier compared to a case where simple particles made of Ga metal only, which have a melting point of 29° C., are used as the conductive particles. If, on the other hand, a film of Ga metal is formed onto each connection electrode 132 to a thickness where A+B:A=90 to 85(%):10 to 15(%), then it is possible to obtain similar beneficial effects to those described above.

Furthermore, a mode is also possible in which the constituent metals of the conductive particles 130 and the connection electrode 132 are reversed, in other words, simple particles made of low-melting-point metal only, or coated particles in which the surface of other simple particles (metal particles, resin particles, or the like) is coated with a low-melting-point metal, are used as the conductive particles 130, and furthermore, a film of Ga metal deposited by plating, or the like, onto the front surface of the underlying electrode (the surface adjacent to the through electrode 102) is used as the connection electrode 132.

As described above, according to the present embodiment, since the electrical connections 110 are constituted by an alloy which assumes a liquid state at room temperature (30° C.) or above, it is possible to ensure electrical conduction which does not rely on mechanical point contacts, and the electrical resistance in the electrical connection 110 can be reduced to a low value. In particular, even in a case where a mechanical vibration is applied, it is possible to absorb this vibration by means of the alloy which is in a liquid state, and therefore the reliability of the electrical connection 110 can be guaranteed.

The range of application of the electrical wiring structure according to the present invention is not limited to the inkjet recording apparatus described above, and the present invention may also be applied to a liquid ejection head used in various types of liquid ejection apparatuses which eject (spray) liquid, such as an industrial high-precision coating apparatus, a resist printing apparatus, a wire printing apparatus for an electronic circuit substrate, a dye application apparatus, and the like.

An electrical wiring substrate, a liquid ejection head, a liquid ejection apparatus and an image forming apparatus according to the present invention have been described in detail above, but the present invention is not limited to the aforementioned examples, and it is of course possible for improvements or modifications of various kinds to be implemented, within a range which does not deviate from the essence of the present invention.

It should be understood that there is no intention to limit the invention to the specific forms disclosed, but on the contrary, the invention is to cover all modifications, alternate constructions and equivalents falling within the spirit and scope of the invention as expressed in the appended claims.

What is claimed is:

1. An electrical wiring structure comprising an electrical connection section where a first electrode and a second electrode are connected, wherein:
   the electrical connection section is formed by a first alloy containing at least gallium metal; and
   the first alloy has a melting point lower than 30° C.

2. The electrical wiring structure as defined in claim 1, wherein one of the first electrode and the second electrode contains the gallium metal, and the other of the first electrode and the second electrode contains an alloying metal which produces the first alloy upon making contact with the gallium metal.

3. The electrical wiring structure as defined in claim 2, wherein the alloying metal is one of indium, zirconium, tin and aluminium.

4. The electrical wiring structure as defined in claim 1, wherein:
   the first electrode is a through electrode formed in a thickness direction of a substrate; and
   the second electrode is a connection electrode which is connected to an end portion of the through electrode.

5. The electrical wiring structure as defined in claim 4, wherein the through electrode has a structure in which a conductive paste containing conductive particles is filled into a through hole formed in the thickness direction of the substrate.

6. The electrical wiring structure as defined in claim 5, wherein the conductive particles are simple particles made of the gallium metal.

7. The electrical wiring structure as defined in claim 5, wherein the conductive particles are coated particles having a surface coated with the gallium metal.

8. The electrical wiring structure as defined in claim 5, wherein the conductive particles are simple particles made of a second alloy which contains the gallium metal and an alloying metal which produces the second alloy upon making contact with the gallium metal, or are coated particles having a surface coated with the second alloy.

9. A liquid ejection head comprising the electrical wiring structure as defined in claim 1.

10. The liquid ejection head as defined in claim 9, wherein displacement of a piezoelectric element is used to pressurize liquid filled into a pressure chamber in such a manner that the liquid is ejected from a nozzle connected to the pressure chamber.

11. A liquid ejection apparatus comprising the liquid ejection head as defined in claim 9.

12. An image forming apparatus comprising the liquid ejection head as defined in claim 9.

* * * * *